(12) United States Patent
Nakano et al.

(10) Patent No.: US 6,275,113 B1
(45) Date of Patent: Aug. 14, 2001

(54) HIGH FREQUENCY TUNING AMPLIFIER FOR BUFFER

(75) Inventors: Kazuhiro Nakano, Fukushima-ken; Hiroki Noumi, Miyagi-ken, both of (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/575,029

(22) Filed: May 19, 2000

(30) Foreign Application Priority Data

May 21, 1999 (JP) .................................................. 11-142070

(51) Int. Cl.[7] ...................................................... H03F 3/191
(52) U.S. Cl. ........................ 330/305; 330/302; 455/191.1
(58) Field of Search ..................................... 330/302, 305, 330/306; 455/191.1, 191.3, 197.1

(56) References Cited

U.S. PATENT DOCUMENTS 5,300,895 * 4/1994 Jones ...................................... 330/306
5,406,226 * 4/1995 Cioffi et al. ........................... 330/306
5,726,606 * 3/1998 Marland ................................ 330/302
5,767,756 * 6/1998 Hwang .................................. 330/306

FOREIGN PATENT DOCUMENTS 11-243349    9/1999   (JP) .

* cited by examiner

*Primary Examiner*—Robert Pascal
*Assistant Examiner*—Khanh Van Nguyen
(74) *Attorney, Agent, or Firm*—Brinks Hofer Gilson & Lione

(57) ABSTRACT

The high frequency tuning amplifier for buffer has a tuning circuit consisting of a serial circuit of the first and second inductors connected between the output of transistor amplifying stage and the power source, a first capacitor connected in parallel to the serial circuit of first and second inductors, a serial circuit of the second and third capacitors connected in parallel to the second inductor and a switching element to which a band switch voltage is supplied, connected between the connecting point of the second and third capacitors and the reference voltage point. The tuning circuit is tuned to the high band frequency when the switching element is turned ON and to the low band frequency when the switching element is turned OFF.

4 Claims, 3 Drawing Sheets

HIGH FREQUENCY TUNING AMPLIFIER FOR BUFFER

BACKGROUND OF THE INVENTION

1. Field of the Invention

The present invention relates to a high frequency tuning amplifier for buffer and particularly to a high frequency tuning amplifier for buffer which is used in common for a first voltage controlled oscillator to generate the high band frequency and a second voltage controlled oscillator to generate the low band frequency to be selectively tuned to amplify the high band frequency and low band frequency.

2. Description of the Related Art

In regard to the mobile communication systems used in the world, DCS (Digital Cellular System) is introduced in Britain, Germany, Italy, France and a part of Asian Countries, while GSM (Global System for Mobile Communications), which is the standard system for European countries for digital mobile telephone system signed in 1982, is employed in European countries, USA, Africa and a part of Asian countries.

In this case, DCS is called a mobile communication system in which a base station frequency is determined as 1805 MHz to 1880 MHz, a mobile station frequency as 1710 MHz to 1785 MHz, an oscillation frequency of a voltage controlled oscillator (VCO) of a portable telephone as 1700 MHz, total of 374 channels are used and GMSK (Gaussian Minimum Shift Keying) system is used as the modulation system. Moreover, GSM is called a mobile communication system in which a base station frequency is determined as 925 MHz to 960 MHz, a mobile station frequency as 880 MHz to 915 MHz, an oscillation frequency of a voltage controlled oscillator (VCO) of a portable telephone as 900 MHz, total of 124 channels are used and GMSK is also used as the modulation system.

Since these two mobile communication systems DCS and GSM are intrinsically mobile communication systems based on different systems, when a user hopes to become a subscriber of these two mobile communication systems, a user is requested to get two types of portable telephones to make mobile communication by the DCS and GSM systems.

However, since DCS and GSM are only different in the available frequency assigned but introduce GMSK system as the modulation system used, a portable telephone which can be used for both DCS and GSM systems is already proposed. In the case of this related art, a first voltage controlled oscillator which generates the 1700 MHz frequency band and a second voltage controlled oscillator which generates the 900 MHz frequency band are arranged within the portable telephone and thereby the first voltage controlled oscillator is used for the mobile communication by the DCS system, while the second voltage controlled oscillator is used through the switching operation for the mobile communication by the GSM system.

Here, FIG. 6 is a block diagram illustrating a structure of layout of two voltage controlled oscillators in the portable telephone of the related art which may be used in both DCS and GSM systems.

As illustrated in FIG. 6, a portable telephone which may be used both in DCS and GSM systems is composed of a first voltage controlled oscillator (first VCO) 61 to generate the frequency of 1700 MHz band (high band frequency), a second voltage controlled oscillator (second VCO) 62 to generate the frequency of 900 MHz band (low band frequency), a first high frequency tuned amplifier 63 for buffer to selectively amplify the high band frequency signal, a second high frequency tuned amplifier 64 for buffer to selectively amplify the low band frequency signal, a high band frequency signal output terminal 65, a low band frequency signal output terminal 66, a power source 67 and a 1-circuit/2-contact switch 68.

The first voltage controlled oscillator 61 is connected at its output terminal to the input terminal of the first high frequency tuned amplifier 63 for buffer, while the power source terminal is connected to one fixed contact of the 1-circuit/2-contact switch 68. The second voltage controlled oscillator 62 is connected at its output terminal to the input terminal of the second high frequency tuned amplifier 64 for buffer, while the power source terminal is connected to the other fixed terminal of the 1-circuit/2-contact switch 68. The first high frequency tuned amplifier 63 for buffer is connected at its output terminal to the high band frequency signal output terminal 65. The second high frequency tuned amplifier 64 for buffer is connected at its output terminal to the low band frequency signal output terminal 66. The power source 67 is connected at its positive output terminal to the movable contact of the 1-circuit/2-contact switch 68 and is also connected at its negative output terminal to the grounding point.

In the above structure, when the portable telephone is used for mobile communication by the DCS system, the movable contact of the 1-circuit/2-contact switch 68 is connected by the switching operation to one fixed contact. In this case, the power source 67 supplies a drive power to the first voltage controlled oscillator 61 to operate the first voltage controlled oscillator 61 in order to output the high band frequency (1700 MHz band) therefrom. This high band frequency signal is selectively amplified by the first high frequency tuning amplifier for buffer and is then supplied to the available circuits from the high band frequency signal output terminal 65. Meanwhile, when the portable telephone is used for mobile communication by the GSM system, the movable contact of the 1-circuit/2-contact switch 68 is connected by the switching operation to the other fixed contact. In this case, the power source 67 supplies a drive power to the second voltage controlled oscillator 62 to operate the second voltage controlled oscillator 62 in order to output the low band frequency (900 MHz band) signal from the second voltage controlled oscillator 62. This low band frequency signal is selectively amplified by the second high frequency tuned amplifier 64 for buffer and is then supplied to the available circuits from the low band frequency signal output terminal 66.

In this case, the reason why the first high frequency tuned amplifier 63 for buffer is connected in the output side of the first voltage controlled oscillator 61 and the second high frequency tuned amplifier 64 for buffer in the output side of the second voltage controlled oscillator 62 is that it is difficult to obtain the high frequency tuned amplifier for common use having almost equal gain characteristic and passing band characteristic in both high band frequency and low band frequency.

The existing portable telephone which may be used in common for both DCS and GSM systems has a problem that since the first high frequency tuned amplifier 63 for buffer is connected in the output side of the first voltage controlled oscillator 61 and the second high frequency tuned amplifier 64 for buffer is connected in the output side of the second voltage controlled oscillator 62, two kinds of high frequency tuned amplifiers of the first high frequency tuned amplifier 63 for buffer and second high frequency tuned amplifier 64 for buffer are required and it is required to reserve the space for arrangement of two kinds of high frequency tuned amplifiers within the portable telephone and therefore it is difficult to reduce the size of portable telephone and moreover manufacturing cost becomes high.

SUMMARY OF THE INVENTION

The present invention has been proposed to solve the problems explained above and it is therefore an object of the present invention to provide a high frequency tuning amplifier for buffer which may be selectively tuned to the high band frequency and low band frequency for common use to assure almost equal gain characteristic and pass band characteristic for both high band frequency and low band frequency.

In view of attaining the object explained above, the high frequency tuning amplifier for buffer is provided with a serial circuit of a first inductor and a second inductor connected between an output of the transistor amplifier and the power source, a first capacitor connected in parallel to the serial circuit of the first and second inductors, a serial circuit of a second capacitor and a third capacitor connected in parallel to the second inductor, and a tuning circuit consisting of a switching element to which a band switch voltage is supplied connected between the connecting point of the second and third capacitors and the reference voltage point. This tuning circuit is provided with a means which is tuned to the high band frequency when the switching element is turned ON and is tuned to the low band frequency when the switching element is turned OFF.

According to the means explained above, in the tuning circuit, when the switching element to which a band switch voltage is supplied is turned ON, a circuit consisting of the second and third capacitors and the second inductor operates as a small capacitor and tuning to the high band frequency is mainly set up by a serial circuit of the first inductor and small capacitor and the first capacitor connected in parallel thereto. Meanwhile, when the switching element to which a band switch voltage is not applied is turned OFF, tuning to the low band frequency is mainly set up by the second inductor and the first and third capacitors connected in parallel thereto. Therefore, it is possible not only the tuning frequency of the tuning circuit can effectively selected to the high band frequency or low band frequency depending on existence of the band switch voltage to be supplied to the tuning circuit but also the almost equal gain characteristic and pass band characteristic can be attained when the tuning frequency is switched to the high band frequency and low band frequency. Accordingly, a high frequency tuning amplifier for buffer which may be used in common for selective amplification of the high band frequency and low band frequency can be obtained. Moreover, since the selective amplification of the high band frequency and low band frequency is possible, the number of structural elements required can be reduced and thereby the portable telephone can also be reduced in size and moreover manufacturing cost thereof can also be lowered.

DETAILED DESCRIPTION OF THE PREFERRED EMBODIMENT

The preferred embodiment of the present invention will be explained in detail with reference to the accompanying drawings.

Figure 1:
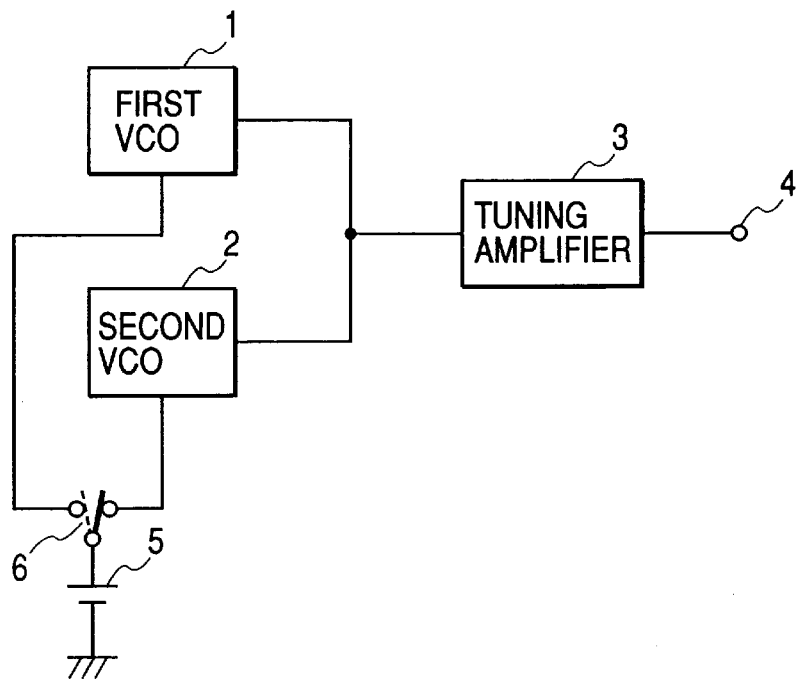
FIG. 1 is a block diagram illustrating a structure of layout of two voltage controlled oscillator in a portable telephone which may be used in common in the DCS and GSM systems utilizing the high frequency tuning amplifier for buffer.

FIG. 1 is a block diagram illustrating a structure of the layout of two voltage controlled oscillators in the portable telephone to be used in both DCS and GSM systems utilizing the high frequency tuning amplifier for buffer of the present invention.

As illustrated in FIG. 1, the portable telephone to be used in both DCS and GSM systems is composed of a first voltage controlled oscillator (first VCO) 1 which generates the frequency of 1700 MHz band (high band frequency), a second voltage controlled oscillator (second VCO) which generates the frequency of 900 MHz band (low band frequency) 2, a high frequency tuned amplifier 3 for buffer to selectively amplify the high band frequency signal and low band frequency signal, a signal output terminal 4, a power source 5 and a 1-circuit/2-contact switch 6.

The first voltage controlled oscillator 1 is connected in its output terminal to the input terminal of the high frequency tuned amplifier 3 for buffer and is also connected in its power source terminal to one fixed contact of the 1-circuit/2-contact switch 6. The second voltage controlled oscillator 2 is connected in its output terminal to the input terminal of the high frequency tuned amplifier 3 for buffer and is also connected in its power source terminal to the other fixed contact of the 1-circuit/2-contact switch 6. The high frequency tuned amplifier 3 for buffer is connected in its output terminal to the signal output terminal 4. The power source 5 is connected it its positive output terminal to the movable contact of the 1-circuit/2-contact switch 6 and also connected in its negative output terminal to the grounding point.

In the structure explained above, when the portable telephone is used for mobile communication by the DCS system, the movable contact of the 1-circuit/2-contact switch 6 is connected through the switching operation to one fixed contact. Thereby, a positive band switch voltage is supplied to the high frequency tuned amplifier 3 for buffer to be tuned to the high band frequency (1700 MHz band frequency). In this case, the power source 5 supplies a drive voltage to the first voltage controlled oscillator 1. Here, the first voltage controlled oscillator 1 is operated to output the high band frequency (1700 MHz band frequency). This high band frequency signal is selectively amplified by the high frequency tuned amplifier 3 for buffer tuned to the high band frequency (1700 MHz band frequency) and is then supplied to the available circuits from the signal output terminal 4. Meanwhile, the portable telephone is used for mobile communication by the GSM system, the movable contact of 1-circuit/2-contact switch 6 is connected through the switching operation to the other fixed contact. Thereby, the positive band switch voltage is not supplied to the high frequency tuning amplifier for buffer and it is tuned to the low band frequency (900 MHz band frequency). In this case, the power source 5 supplies a drive power to the second voltage controlled oscillator 2. Thereby, the second voltage controlled oscillator 2 is operated to output the low band frequency (900 MHz band frequency) signal therefrom. This low band frequency signal is selectively amplified by the high frequency tuned amplifier 3 for buffer tuned to the low band frequency (900 MHz band frequency) and is then supplied to the available circuits from the output terminal 4. The positive band switch voltage may be formed from the signal supplied from the base station of the mobile communication system used by a user or may be formed in the side of portable telephone.

Figure 2:
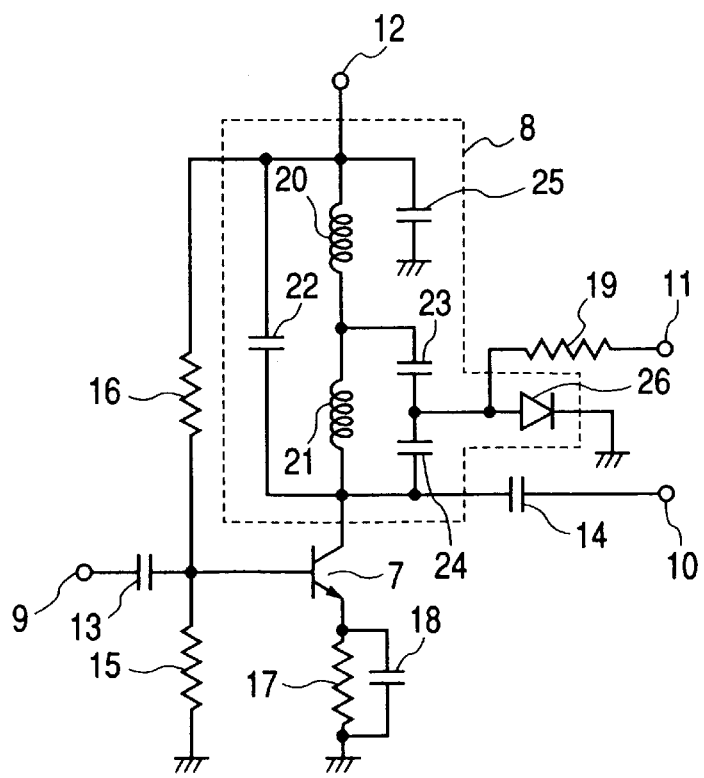
FIG. 2 is a diagram illustrating a circuit structure as an embodiment of the high frequency tuning amplifier for buffer of the present invention.

Next, FIG. 2 illustrates a circuit structure as one embodiment of the high frequency tuning amplifier for buffer of the present invention.

As illustrated in FIG. 2, the high frequency tuning amplifier for buffer of this embodiment is provided with a transistor 7, a tuning circuit 8, a signal input terminal 9, a signal output terminal 10, a band switch voltage input terminal 11, a power source terminal 12, coupling capacitors 13, 14, base bias resistors 15, 16, a emitter resistor 17, an emitter bypass capacitor 18 and a buffer resistor 19. Moreover, the tuning circuit 8 is provide with a first inductor 20, a second inductor 21, a first capacitor 22, a second capacitor 23, a third capacitor 24, a bypass capacitor 25 and a switching diode 26.

The transistor 7 is respectively connected at its base to the signal input terminal 9 via a coupling capacitor 13, to the grounding point via the base bias resistor 15 and to the power source terminal 12 via the base bias resistor 16 and is also connected at its emitter to the grounding point of the parallel connecting circuit of the emitter resistor 17 and emitter bypass capacitor 18, and connected at its collector to the power source terminal 12 via the tuning circuit S and to the signal output terminal 10 via the coupling capacitor 14. Moreover, in the tuning circuit 8, the first inductor 20 and second inductor 21 are connected serially and the first capacitor 22 is connected in parallel to such serial connecting circuit. The serial connecting circuit of the first inductor 20 and second inductor 21 is connected at its one end to the power source terminal 12 and connected at its other end to the collector of the transistor 7. The second capacitor 23 and third capacitor 24 are connected serially and the second inductor 21 is connected in parallel to this serial connecting circuit. One end of the bypass capacitor 25 is connected to the power source terminal 12, while the other end to the grounding point. The anode of the switching diode 26 is connected to the connecting point of the second capacitor 23 and third capacitor 24 and is also connected to the band switch voltage input terminal 11 via the buffer resistor 19 and the cathode of the switching diode 13 is connected to the grounding point.

In this case, inductance of the first inductor 20 is selected to be larger than inductance of the second inductor 21. Moreover, capacitance of the second capacitor 23 is set considerably larger than that of the first capacitor 22. For example, when the capacitance of the former is 1000 pF, capacitance of the latter is about 2 pF.

Figure 3A:
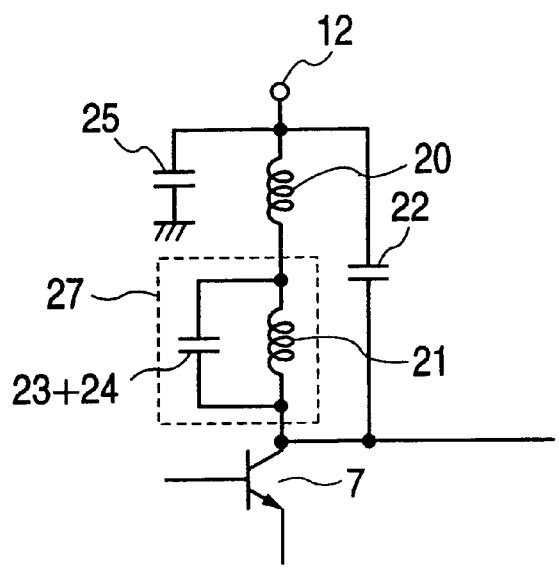
FIG. 3A and 3B is a circuit diagram illustrating main circuit elements which have important role when the tuning circuit illustrated in FIG. 2 is tuned to the low band frequency and a circuit diagram illustrating an equivalent circuit of the tuning circuit for the tuning explained above.
Figure 3B:
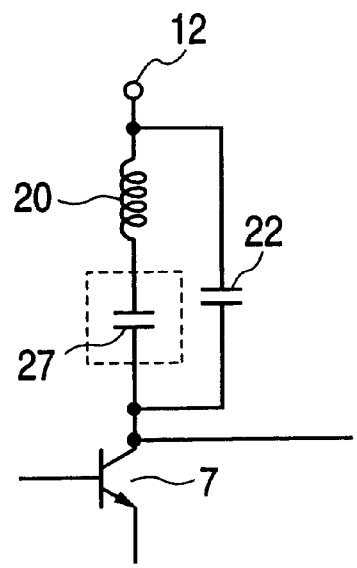

Here, FIG. 3A is a circuit diagram illustrating main circuit elements for tuning the tuning circuit 8 of FIG. 2 to the low band frequency, while FIG. 3B is a circuit diagram illustrating an equivalent circuit of the tuning circuit 8 when it is tuned to the low band frequency.

Figure 4A:
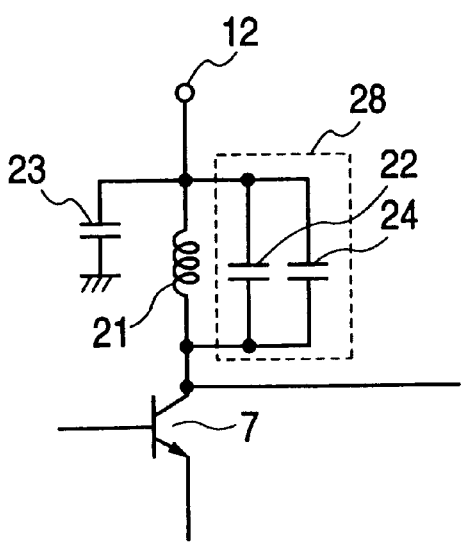
FIG. 4A and 4B is a circuit diagram illustrating main circuit elements which have important role when the tuning circuit illustrated in FIG. 2 is tuned to the high band frequency and a circuit diagram illustrating an equivalent circuit of the tuning circuit for the tuning explained above.
Figure 4B:
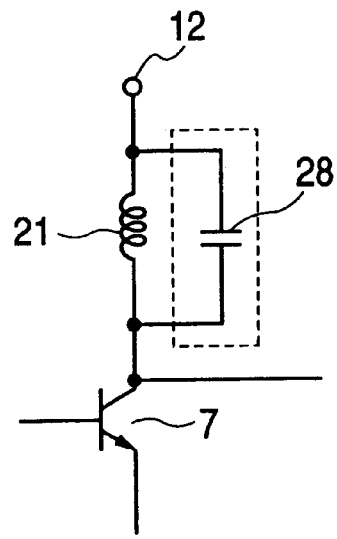

FIG. 4A is a circuit diagram illustrating main circuit elements for tuning the tuning circuit 8 of FIG. 2 to the high band frequency, while FIG. 4B is a circuit diagram illustrating an equivalent circuit of the tuning circuit 8 when it is tuned to the high band frequency.

In FIGS. 3A, 3B and FIGS. 4A, 4B, numeral 27 designates a small capacitor indicated by a parallel circuit with the serial circuit of the second inductor 21, second capacitor 23 and third capacitor 24, while 28 designates a total capacitor indicated by a parallel circuit of the first capacitor 22 and fourth capacitor 24. The structural elements like those of FIG. 2 are designated by the like reference numerals.

The high frequency tuning amplifier for buffer of this embodiment having the structure explained above operates as follows.

First, when the high frequency tuning amplifier for buffer is tuned to the low band frequency signal of 900 MHz band to selectively amplify the low band frequency signal, the positive band switch voltage is not supplied to the band switch voltage input terminal 11, the switching diode 26 of the tuning circuit 8 turns OFF and the connecting point of the second capacitor 23 and third capacitor 24 is isolated from the grounding point. As illustrated in FIG. 3A, the tuning circuit 8 is set to the tuning frequency of 900 MHz band by the serial circuit of the first inductor 20 and second inductor 21, first capacitor 22 connected in parallel to such serial circuit, serial circuit of the second capacitor 23 and third capacitor 24 connected in parallel to the second inductor 21 and bypass capacitor 25. In this case, the circuit consisting of the second inductor 21 and the serial circuit of the second capacitor 23 and third capacitor 24 connected in parallel to such second inductor 21 shows a small capacitor 27 in the tuning frequency of 900 MHz band and the circuit illustrated in FIG. 3A becomes an equivalent circuit consisting of the serial circuit of the first inductor 20 and small capacitor 27 and the first capacitor 22 connected in parallel to such serial circuit and can easily set the tuning frequency of tuning circuit 8 to 900 MHz band.

In this case, when the low band frequency (900 MHz band frequency) signal is supplied to the signal input terminal 9, such signal is selectively amplified by the grounded emitter transistor 7 and the tuning circuit 8 tuned to the low band frequency and is then supplied to the available circuits via the signal output terminal 10.

Next, when the high frequency tuning amplifier for buffer is tuned to the high band frequency signal of 1700 MHz band to selectively amplify the high band frequency signal, the positive band switch voltage is supplied to the band switch voltage input terminal 11, the switching diode 26 of the tuning circuit 8 turns ON and the connecting point between the second capacitor 23 and third capacitor 24 is connected to the grounding point. The tuning circuit 8 is set to the tuning frequency of 1700 MHz band, as illustrated in FIG. 4A, by the second inductor 21, parallel circuit of the first capacitor 22 and third capacitor 24 connected in parallel to the second inductor 21, and second capacitor 23 connected to the connecting point via one end of the second inductor 21 and the switching diode 26. In this case, the parallel circuit of the first capacitor 22 and third capacitor 24 shows a total capacitor 28 in the tuning frequency of 1700 MHz band and the circuit illustrated in FIG. 4A becomes the equivalent circuit consisting of the second inductor 21 and total capacitor 28 connected in parallel as illustrated in FIG.

4B. Thereby, the tuning frequency of the tuning circuit 8 can easily be set to the 1700 MHz band.

In this case, when the high band frequency (1700 MHz band frequency) signal is supplied to the signal input terminal 9, such signal is selectively amplified by the grounded emitter transistor 7 and the tuning circuit 8 tuned to the high band frequency and is then supplied to the available circuits via the signal output terminal 10.

Figure 5:
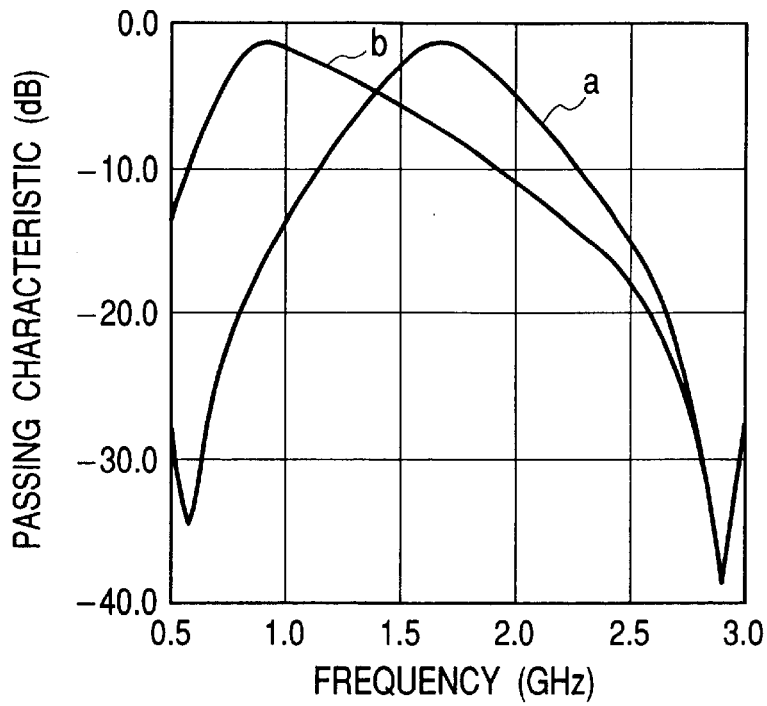
FIG. 5 is a characteristic diagram illustrating an example of the amplification vs. frequency characteristic in the high frequency tuning amplifier for buffer illustrated in FIG. 2.
Figure 6:
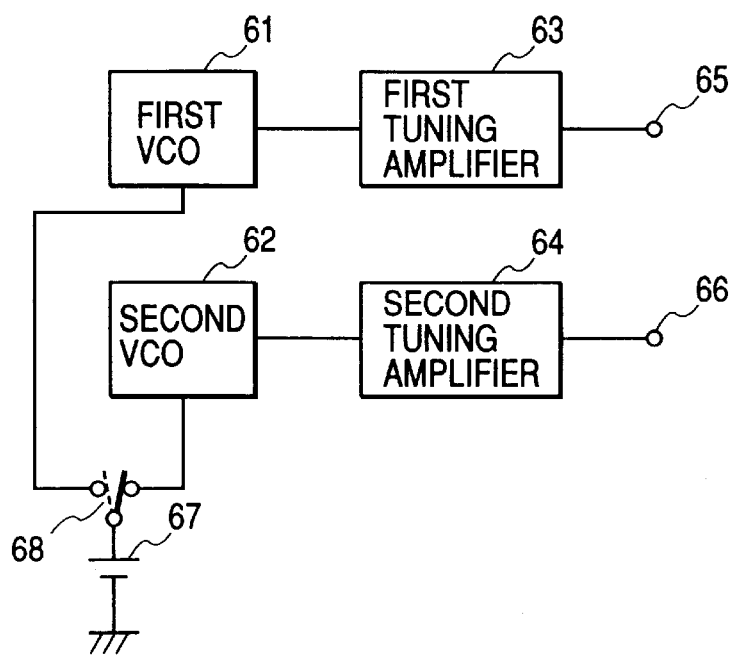
FIG. 6 is a schematic structural diagram illustrating the structural part including the existing high frequency tuning amplifier for buffer and voltage controlled oscillator of the portable telephone.

Next, FIG. 5 is a characteristic diagram illustrating an example of the amplification vs. frequency characteristic in the high frequency tuning amplifier for buffer illustrated in FIG. 2.

In FIG. 5, frequency is plotted on the horizontal axis (GHz) and the pass band characteristic is plotted on the vertical axis (dB). The curve a shows the characteristic when the tuning circuit 8 is tuned to the high band frequency of 1.7 GHz band (1700 MHz band), while the curve b shows the characteristic when the tuning circuit 8 is tuned to the low band frequency of 0.9 GHz (900 MHz band).

As shown by the curves a and b of FIG. 5, the high frequency tuning amplifier for buffer has almost equal amplification gain and pass bandwidth for selectively amplifying the high band frequency signal and low band frequency signal.

As explained above, the high frequency tuning amplifier for buffer has almost equal selective amplification characteristic for the high band frequency signal and low band frequency signal, the portable telephone may be used in common in the DCS and GSM systems. Thereby, the required number of high frequency tuned amplifiers for buffer can be reduced and thereby the portable telephone can be reduced in size and manufacturing cost can also be lowered.

In above explanation, the preferred embodiment is operated in the mobile communication system by the DCS system of 1700 MHz band and in the mobile communication system by the GSM system of 900 MHz band. But, the high band frequency and low band frequency is never limited to that of the mobile communication systems by the DCS and GSM systems and the present invention can also be applied in the same manner to the other systems similar to above systems.

According to the present invention, as explained above, not only the tuning frequency of tuning circuit can be effectively selected to the high band frequency or low band frequency but also almost equal gain characteristic and pass bandwidth characteristic can be attained when the tuning frequency is switched to the high band frequency or low band frequency depending on existence of the band switch voltage supplied to the tuning circuit. Therefore, the high frequency tuning amplifier for buffer which may be used in common for selective amplification of the high band frequency and low band frequency can be attained. Since selective amplification of the high band frequency and low band frequency is executed, the required number of structural elements can be reduced and the portable telephone can also be reduced in size, resulting in the effect that manufacturing cost can be lowered.

What is claimed is:

1. A high frequency tuning amplifier for buffer comprising a tuning circuit including: a first serial circuit of a first and a second inductors connected between an output of a transistor amplifying stage and a power source; a first capacitor connected in parallel to said first serial circuit of first and second inductors; a second serial circuit of second and third capacitors connected in parallel with the second inductor; and a switching element connected between said connecting point of the second and third capacitors and a reference voltage point to receive supply of a band switch voltage, wherein said tuning circuit is tuned to a high band frequency when said switching element is turned ON and tuned to a low band frequency when said switching element is turned OFF.

2. A high frequency tuning amplifier for buffer according to claim 1, wherein, in said tuning circuit, a circuit comprising the second and third capacitors and the second inductor operate as a small capacitor when the switching element is turned ON, and the tuning frequency is mainly set by a third serial circuit of the first inductor and said small capacitor and the first capacitor connected in parallel to the third serial circuit.

3. A high frequency tuning amplifier for buffer according to claim 1, wherein the tuning frequency of said tuning circuit is mainly set, when the switching element is turned OFF, by the second inductor and the first and third capacitors connected in parallel to the second inductor.

4. A high frequency tuning amplifier for buffer according to claim 1, wherein said high band frequency is a 1.7 GHz band frequency that is output from a first voltage controlled oscillator and said low band frequency is a 900 MHz band frequency that is output from a second voltage controlled oscillator.

* * * * *